(12) United States Patent
Mueller et al.

(10) Patent No.: US 9,986,354 B2
(45) Date of Patent: May 29, 2018

(54) PRE-MOLD FOR A MICROPHONE ASSEMBLY AND METHOD OF PRODUCING THE SAME

(71) Applicant: Infineon Technologies AG, Neubiberg (DE)

(72) Inventors: Thomas Mueller, Lapperdorf (DE); Horst Theuss, Wenzenbach (DE); Stefan Uwe Schindler, Reichenbach (DE); Dominik Kohl, Wenzenbach (DE); Jochen Dangelmaier, Beratzhausen (DE)

(73) Assignee: Infineon Technologies AG, Neubiberg (DE)

( * ) Notice: Subject to any disclaimer, the term of this patent is extended or adjusted under 35 U.S.C. 154(b) by 109 days.

(21) Appl. No.: 13/927,865

(22) Filed: Jun. 26, 2013

(65) Prior Publication Data

US 2015/0001646 A1    Jan. 1, 2015

(51) Int. Cl.
| | |
|---|---|
| *H01L 29/84* | (2006.01) |
| *H01L 21/78* | (2006.01) |
| *H04R 25/00* | (2006.01) |
| *B81C 1/00* | (2006.01) |
| *H01L 23/495* | (2006.01) |

(Continued)

(52) U.S. Cl.
CPC .......... *H04R 31/00* (2013.01); *B81C 1/0023* (2013.01); *B81C 1/00301* (2013.01); *H04R 19/005* (2013.01); *H04R 19/04* (2013.01); *B81B 2201/0257* (2013.01); *B81B 2207/092* (2013.01); *B81B 2207/096* (2013.01); *H01L 2224/05554* (2013.01); *H01L 2224/48091* (2013.01); *H01L 2224/48137* (2013.01); *H01L 2224/8592* (2013.01);

(Continued)

(58) Field of Classification Search
CPC ....... H01L 2924/3025; H01L 23/49827; H01L 2924/1461; H01L 21/563; H01L 41/04; H01L 2224/8592; H01L 2224/48091; H01L 2224/05554; H01L 2224/48137; H01L 2924/16195; B60R 2021/01516; B60R 2021/01537; B81B 2201/0257; B81B 2207/096; B81B 2207/095; B81B 7/0064; B81B 7/0061; B81B 7/007; B81B 2207/012; B81B 2207/092; H04R 31/00; H04R 19/005; H04R 19/04; B81C 1/0023; B81C 1/00301
USPC .................................................. 257/400–430
See application file for complete search history.

(56) References Cited

U.S. PATENT DOCUMENTS 7,202,552 B2 * 4/2007 Zhe ........................ B81C 1/0023
257/659
8,921,955 B1 * 12/2014 Lee et al. ...................... 257/416

(Continued)

FOREIGN PATENT DOCUMENTS

| CN | 1545484 A | 11/2004 |
|---|---|---|
| CN | 1933680 A | 3/2007 |

(Continued)

*Primary Examiner* — Marcos D Pizarro
*Assistant Examiner* — Nelson Garces (57) ABSTRACT

A microphone assembly is provided, wherein the pre-mold comprises a bent leadframe and a mold body, wherein the mold body is mold to at least partially encapsulate the bent leadframe to build the pre-mold comprising a cavity for accommodating a microphone, and wherein the pre-mold comprises a through-hole transmissive for sound waves.

10 Claims, 7 Drawing Sheets

(51) Int. Cl.
*H04R 31/00* (2006.01)
*H04R 19/00* (2006.01)
*H04R 19/04* (2006.01)
*H04R 1/08* (2006.01)

(52) U.S. Cl.
CPC ........... *H01L 2924/10158* (2013.01); *H01L 2924/16195* (2013.01); *H04R 1/086* (2013.01); *Y10T 29/49121* (2015.01)

(56) References Cited

U.S. PATENT DOCUMENTS

| | | | |
|---|---|---|---|
| 2005/0189635 A1* | 9/2005 | Humpston | B81B 7/0077 257/678 |
| 2008/0298621 A1* | 12/2008 | Theuss | B81C 1/0023 381/360 |
| 2009/0002961 A1 | 1/2009 | Camacho et al. | |
| 2010/0086146 A1 | 4/2010 | Gong et al. | |
| 2013/0032905 A1* | 2/2013 | Lo | B81B 7/007 257/416 |

FOREIGN PATENT DOCUMENTS

| | | |
|---|---|---|
| CN | 1942393 A | 4/2007 |
| CN | 103125019 A | 5/2013 |
| DE | 10 2008 007 682 A1 | 12/2008 |

* cited by examiner

PRE-MOLD FOR A MICROPHONE ASSEMBLY AND METHOD OF PRODUCING THE SAME

BACKGROUND OF THE INVENTION

Field of the Invention

The present invention relates to a pre-mold for a microphone assembly, to microphone assemblies and methods of manufacturing the same.

Description of the Related Art

In the art a plurality of semiconductor devices and housings of the same are known. A specific field of housings is the field of housings or packages for Si-microphone chips or micro-electro-mechanical system (MEMS) microphone chips. These MEMS microphone chips comprising thin (e.g. in the order of magnitude of a few 100 nm) oscillating membranes on the active side of the MEMS microphone chip. Additionally, the membrane may be metallized so that the oscillation can be sensed by way of a capacitive coupling with an electrode arranged opposing the membrane. An important factor of the performance of housed Si-microphone is the rear volume which denotes the volume behind the membrane, when seen in the direction of the arriving sound wave, since this rear volume represents a compensation volume for the oscillating membrane. This rear volume has to be provided in the package.

The rear volume for the membrane of a MEMS microphone is provided by etching the MEMS microphone chip from the backside to expose the membrane. Then the MEMS microphone chip is mounted on and wire bonded to a substrate comprising several layers and typically produced by printed circuit board techniques. After the mounting and wire bonding of the MEMS microphone chip (and of an optional ASIC chip) a lid or housing is glued to the substrate for covering the microphone. In order to let pass the sound waves to the membrane of the MEMS microphone chip the lid comprises a through-hole. The lid may be formed by electric conductive material and may be electrically connected to the ground terminal of the substrate so that the lid as well provides a shielding against electromagnetic interference.

Figure 7:
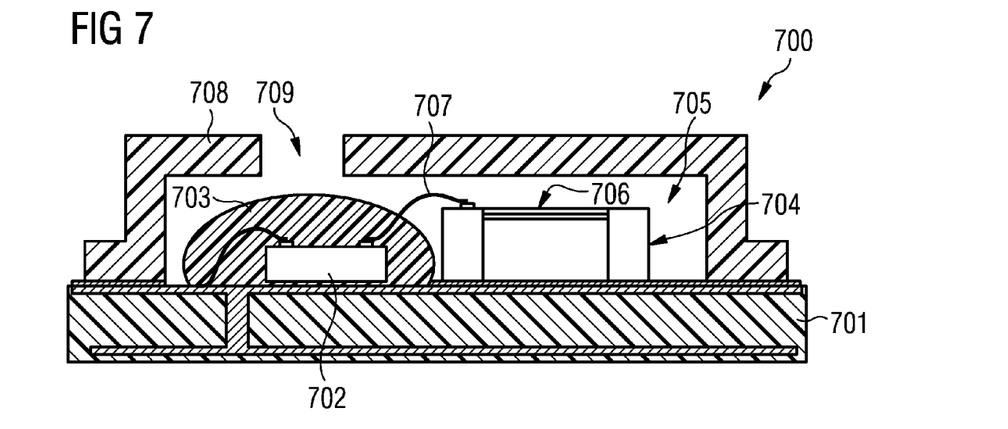
FIG. 7 schematically shows such a microphone assembly.

FIG. 7 schematically shows such a MEMS microphone assembly 700, comprising a multilayer substrate 701 onto which an ASIC 702 is placed and covered by a passivation or protection layer 703. Furthermore, a MEMS microphone chip 704 is mounted to the multilayer substrate 701 and comprising a rear volume 705 used as a balancing or compensation volume for an oscillating membrane 706 of the microphone. The MEMS microphone chip 704 and the ASIC 702 are electrically connected by wires 707 to the substrate. For covering the MEMS microphone chip and the ASIC a lid 708 is provided which comprises a through-hole 709 and is connected to the multilayer substrate 701.

However, there is still potential room to improve the manufacturing process of such microphone assemblies.

SUMMARY OF THE INVENTION

There may be a need to provide a pre-mold for a microphone assembly, a microphone assembly and methods of manufacturing such pre-molds which are simple to perform and which allow for a high performance of the microphone assembly.

According to an exemplary aspect a pre-mold for a microphone assembly is provided, wherein the pre-mold comprises a bent leadframe and a mold body, wherein the mold body is mold to at least partially encapsulate bent leadframe to build the pre-mold comprising a cavity for accommodating a microphone, and wherein the pre-mold comprises a through-hole transmissive for sound waves.

According to another exemplary aspect a microphone assembly is provided which comprises a pre-mold according to an exemplary aspect, a microphone comprising a membrane element and arranged in the cavity of the pre-mold, wherein the membrane element of the microphone is arranged in fluid connection with the through-hole.

According to another exemplary aspect a method of manufacturing a pre-mold for a microphone assembly is provided, wherein the method comprises providing a bent leadframe of a predetermined shape and forming a pre-mold comprising a cavity for accommodating a microphone by molding a mold body to at least partially encapsulate the bent leadframe, wherein the pre-mold comprises a through-hole transmissive for sound waves.

According to another exemplary aspect a microphone assembly configured as a micro-electro-mechanical system is provided, wherein the microphone assembly comprising a housing structure comprising a through-hole, and a microphone configured as a micro-electro-mechanical system and comprising a membrane element and a rim portion forming a circumferential fixing of the membrane element and surrounding a front volume of the microphone, wherein the microphone is arranged in the housing structure so that the through-hole is in fluid connection with the front volume of the microphone.

The use of a method of manufacturing a pre-mold for a microphone assembly may allow for a simple and efficient method for manufacturing a pre-mold. In particular, the use of a cast-in or mold-in leadframe as a pre-mold may allow to provide a large rear-volume which may be provided by a simple structure of the pre-mold, in particular by the cavity of the pre-mold. In particular, the simple structure of the pre-mold may also allow for a low cost pre-mold as a package for a microphone, for example.

Furthermore, by using a pre-mold molded about or around a leadframe or having as a core-structure a leadframe it may be possible to use the leadframe as a shielding, e.g. as a shielding against electromagnetic interferences.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DESCRIPTION OF FURTHER EXEMPLARY EMBODIMENTS

In the following, further exemplary embodiments of the pre-mold, the microphone assembly and a method of producing the pre-mold will be explained. It should be noted that embodiments described in the context of the pre-mold, the microphone assembly or the method of producing a pre-mold may also be combined with embodiments of one of the other categories.

According to an exemplary aspect a method of manufacturing a packaged microphone assembly is provided, wherein the method comprises providing a pre-mold comprising a bent leadframe and a mold body, wherein the mold body is mold to at least partially encapsulate the bent leadframe to build the pre-mold comprising a cavity for accommodating a microphone, and wherein the pre-mold comprises a through-hole transmissive for sound waves; and arranging a microphone comprising a membrane element into the cavity so that the membrane element of the microphone is in fluid connection with the through-hole.

In particular, the cavity may provide a (or at least a portion of a) rear volume for the membrane element. For example, the through-hole may be arranged in a bottom portion of the mold body and may form a port for the passing through or transmission of sound waves. In particular, the leadframe comprises an electrically conductive material. For example the bent leadframe may be bent by use of a forming process, e.g. a thermoforming process, a deep-drawing process, a bending process or the like. In particular, the pre-mold may be used for manufacturing a micro-electro-mechanical system (MEMS) microphone or microphone assembly. However, it may also be used for manufacturing any micro-electro-mechanical system comprising a MEMS chip needing a rear volume or any other microphone.

It should be noted that of course a plurality of pre-molds may be produced or manufactures together in an array-like structure. After the moulding process the array like structure comprising the plurality of pre-molds the pre-molds may be singularized.

The use of a cast-in or mold-in leadframe as a pre-mold may allow to provide a large rear-volume which may be provided by a simple structure of the pre-mold, in particular by the cavity of the pre-mold. In particular, the simple structure of the pre-mold may also allow for a low cost pre-mold as a package for a MEMS microphone, for example.

The mold body may be formed by molding a suitable molding material. In particular, a molding material may be any viscous, plastic or liquid so that it can be molded or casted, for example an insulating material, like a resin.

The term "cavity" may particularly denote a hollow area or place which is formed by a body, e.g. a pre-mold, and into which a unit, element, chip or sensor may be placed or arranged. It should be noted that the term "cavity" does not necessary mean that the cavity is surrounded on all sides by material, e.g. a top or bottom side of the body may be open. That is, also a substantially cuboid body formed by a bottom surface or plate and four lateral faces without a top surface may fall under the definition of the term "cavity".

The term "pre-mold" or "pre-mold package" may particularly denote a unit or element which may be used as a part or as a housing or package for an active component, or sensor, like a microphone, in particular a MEMS microphone. It should be noted that a pre-mold has to be distinguished from a multilayer substrate which comprises several layers which are typically manufactured by printed circuit board techniques and not by a molding technique.

The term "front volume" may in particular denote a volume which is arranged before the membrane element of a microphone on the side from which the sound waves impact the membrane element. In particular, it is arranged on the opposite side with respect to the membrane element as the rear volume.

The term "fluid connection" or "fluid communication" may particularly denote that a fluid, e.g. a gas or a liquid can be lead through the fluid connection from one point to another point. For example, a through hole may allow that gas or oscillating gas (i.e. a sound wave) is passing through the through hole from an outside to an inside, e.g. a cavity formed in a body.

The term "membrane element" may particularly denote an element which converts a mechanical oscillation, e.g. a sound wave, into an electrical signal or oscillating. The membrane element may comprise one or several, e.g. two membranes, and some further components, e.g. electrodes arranged on or at the membrane(s) and may be adapted to register or detect the mechanical oscillation by registering changes of an electrical property, e.g. capacity or charge or the like.

According to an exemplary embodiment of the pre-mold the pre-mold forms a portion of one package types out of the group consisting of leadless or no-lead package; gull-wing leaded package; and J-bend leaded package.

In particular, the leadframe may be bent or deep drawn according to a predetermined type before the lead-frame is cast-in or mold-in to form the pre-mold which then may form a portion or part of a package or housing used to package a sensor, like a microphone. By providing different types of packages different needs may be suited, e.g. electrical connections may be provided at positions which are best suited for the specific later use of the packages assembly, e.g. a microphone assembly.

According to an exemplary embodiment the pre-mold further comprises electrical contact interfaces electrically connected to the leadframe.

In particular, the electrical contact interfaces may be contact pads or contact terminals. For example, the electrical contact interfaces may be arranged or located at an inner surface of the cavity of the pre-mold. Thus, it may be possible to easily connect a microphone, MEMS microphone, or MEMS chip arranged or placed in the cavity electrically to the leadframe and via the leadframe to external electrical contacts, e.g. to a ground potential.

According to an exemplary embodiment of the pre-mold the pre-mold comprises a base portion in which the through-hole is formed.

In particular, the base portion may form a base plate or bottom plate of the pre-mold onto which the microphone, e.g. a MEMS microphone may be arranged, fixed and/or attached to.

In case a microphone is arranged above the through-hole, so that sound waves impact on the membrane element, it may be possible that the cavity formed in the pre-mold forms the rear volume of the later microphone assembly. Thus, an efficient way may be provided to allow a large rear volume for a microphone assembly.

According to an exemplary embodiment of the pre-mold at least one exposed portion of the lead frame is guided out of the pre-mold at a position out of the group consisting of at the bottom portion; and at a top portion opposite to the bottom portion.

In particular, the exposed portion or exposed portions may form, leads, contact terminals or interfaces by which the leadframe, and thus a microphone when arranged in the cavity and electrically connected to the leadframe, may be electrically connected to external contact terminals or pads. In particular, the exposed portion or portions may be guided or let out of the mold body of the pre-mold at the bottom of the pre-mold. Alternatively or additionally exposed portions of the leadframe may be guided out to the opposite side of the pre-mold, i.e. in a direction of the top portion or at the top portion of the pre-mold, in which case they may be electrically connected to a lid used to cover the pre-mold.

According to an exemplary embodiment of the microphone assembly the microphone is a micro-electro-mechanical system microphone.

According to an exemplary embodiment of the microphone assembly the microphone is electrically connected with the leadframe.

Thus, an easy way to electrically connect the microphone or MEMS chip with external contact pads or contact terminals may be provided. For example, the leadframe may be connected to ground so that it serves as electrical ground for the microphone or MEMS chip and as well may have a shielding function.

According to an exemplary embodiment the microphone assembly further comprises a lid which is arranged on the pre-mold and covering the cavity.

For example, the lid may be glued (e.g. by an electrically conductive glue) and/or clipped to the pre-mold and may form one portion of the package. In particular, the lid may close the cavity and thus form a portion of the package or housing the microphone of the microphone assembly is housed with. The lid may be electrically conductive, e.g. formed by a metal, or may be electrically insulating, e.g. formed by a plastic.

According to an exemplary embodiment of the microphone assembly the lid comprises an electrically conductive structure.

In particular, the lid may be formed by an electrically conductive structure. The electrically conductive structure may be a metal structure or may at least comprise metal. The provision of a lid comprising an electrically conductive structure may allow that the lid operates or functions as an electric, magnetic or electromagnetic shield. Thus, it may at least partially shield the microphone or microphone chip arranged in the cavity.

According to an exemplary embodiment the microphone assembly further comprises a carrier structure, wherein the pre-mold is attached to the carrier structure.

In particular, the attaching may be performed by soldering, die-bonding, surface mounting, flip-chip mounting, gluing, e.g. by an electrically conductive glue, or any other way which allows a fixedly connection as well as an electrical connection. For example, the carrier structure may be a printed circuit board (PCB) or another circuit board or structure comprising conductive paths.

According to an exemplary embodiment the microphone assembly further comprises a shielding layer arranged between the carrier structure and the microphone.

In particular, the shielding layer may be an electrically conductive layer. The provision of a shielding layer may allow an improved shielding of the microphone or MEMS chip forming the microphone against electromagnetic influences.

According to an exemplary embodiment the microphone assembly further comprises an ASIC chip arranged in the pre-mold and electrically connected to the microphone.

The provision of an ASIC chip which is as well arranged in the pre-mold, in particular in the cavity of the pre-mold, may be an efficient way to provide specific functions for the microphone assembly. For example, the ASIC chip may be die-bonded, surface mounted, flip-chip mounted, soldered or glued (e.g. an electrically conductive glue) to the pre-mold. It should be noted that the ASIC may be formed by a chip separate to the microphone or may be monolithically formed together with the microphone, e.g. a MEMS microphone and the ASIC may be formed as one single chip.

According to an exemplary embodiment of the microphone assembly the ASIC chip is covered by a protection layer.

In particular, the protection layer may be a passivation layer or a so called glob-topping. The provision of a protection layer for the ASIC may be in particular useful since the cavity of the pre-mold, into which the ASIC chip may be placed, may not be filled with a filler or passivation material, since this cavity provides the rear volume of the microphone. Thus, a specific protection layer covering the ASIC and not filling the whole cavity may be an efficient way to provide for a large rear volume for the microphone while still provide for a protection for the ASIC chip.

According to an exemplary embodiment the method further comprises providing an unbent leadframe; and creating the bent leadframe by applying a forming process to the unbent leadframe.

In particular, the forming process may be a deep-drawing process, a bending process, a thermoforming process or the like.

Summarizing a gist of an exemplary embodiment may be seen in providing a pre-mold for a microphone assembly comprising a pre-bent leadframe onto which a mold body is molded and forming a cavity which can serve as a rear volume for the microphone when it is arranged in the cavity of the pre-mold. In principle both typical construction, i.e. a top port version and a bottom port version of a microphone assembly may be implemented when using a pre-mold according to an exemplary embodiment. In particular, the leadframe may be bent or formed by a deep drawing process or any other suitable forming process. Advantageously portions of the leadframe are exposed or projecting out of the mold body so that the projecting portions may be usable as connecting terminals or interfaces for an electrical connection. Additionally, a metal leadframe may act as a shielding for a microphone e.g. a MEMS microphone, arranged in the cavity optionally together with a further semiconductor circuit or chip, e.g. an ASIC.

By using the pre-mold according to an exemplary embodiment it may be possible to achieve a low cost housing or packaging for a microphone assembly, since no costly multilayer substrates but only a simple leadframe is provided. Additionally, a large rear volume may be easily provided, since the rear volume is not achieved by an etching process at the backside of the membrane element but is provided by the cavity built by the bent leadframe and the mold body molded about the same.

DETAILED DESCRIPTION OF THE FIGURES

The above and other objects, features and advantages of the present invention will become apparent from the following description and the appended claims, taken in conjunction with the accompanying drawings, in which like parts or elements are denoted by like reference numbers.

The illustration in the drawing is schematically and not necessarily to scale.

Figure 1A:
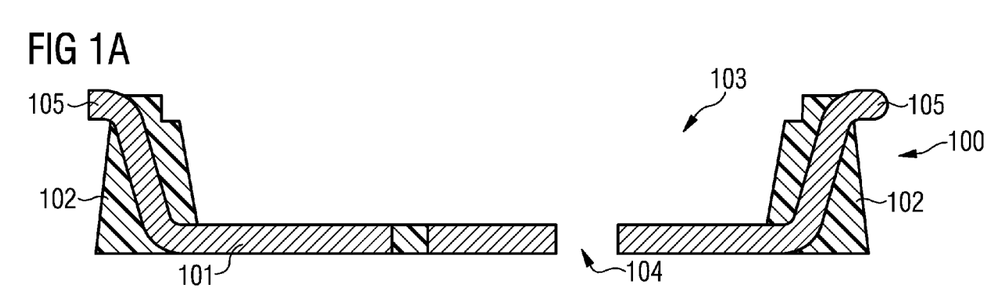
FIGS. 1A-1C show a microphone assembly in different stages of manufacture according to an exemplary embodiment.

FIG. 1 schematically shows a method for manufacturing a microphone assembly according to an exemplary embodiment. In particular, FIG. 1A shows a pre-mold 100 comprising a bent leadframe 101 which is cast-in by a mold body 102. The mold body 102 together with the leadframe 102 forms an open cavity 103 which is connected to the outside by a through-hole 104 in a bottom portion of the pre-mold. Portions 105 of the leadframe 101 project out of the mold body 102. These portions form leads of the leadframe and may be used for electric connection afterwards.

Figure 1B:
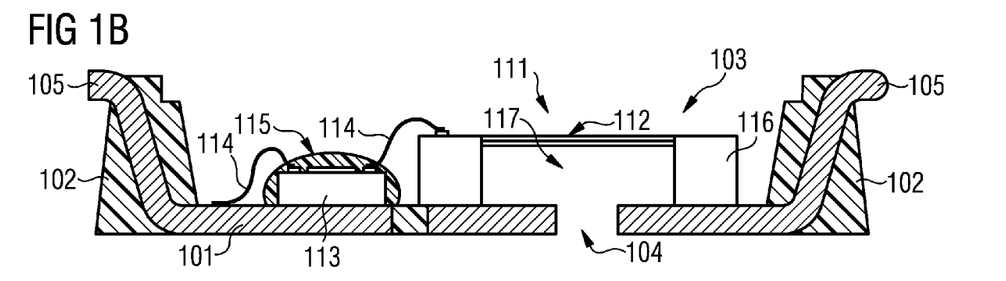

FIG. 1B shows the pre-mold of FIG. 1A after a microphone, in particular a micro-electro-mechanical system (MEMS) microphone, is arranged in and attached to the cavity 103. The microphone 111 comprises a membrane element 112 and a rim portion 116 to which the membrane element is fixed. The rim portion 116 together with the membrane element forms a front volume 117 of the microphone 111. For example, the microphone may be soldered, die-bonded, flip-chip mounted or surface mounted to the bottom portion of the pre-mold 100. In particular, the microphone 111 is arranged directly over the through-hole 104, so that the front volume 117 is in fluid or direct connection or acoustic communication to the through-hole 104 and the cavity 103 forms the rear volume of the microphone 111. Additionally an ASIC 113 is arranged, e.g. die-bonded, soldered, or flip-chip mounted, in the cavity as well and is connected via bond-wires 114 to the microphone 111 and to the leadframe 101 for electrically connecting the microphone 111 and itself to the leadframe 101. The ASIC is covered by a protection layer 115, which may be made of a polymeric material. The protection layer 115 may prevent corrosion of open aluminum contacts or the like of the ASIC.

Figure 1C:
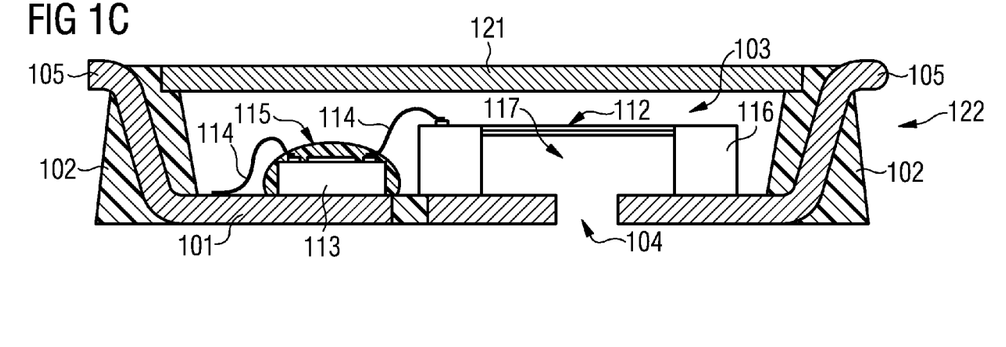

FIG. 1C shows the pre-mold of FIG. 1B further comprising a lid 121 arranged on top of the pre-mold 100 and covering or closing the cavity 103. In particular FIG. 1C depicts the main components of a microphone assembly 122 which can afterwards be bonded or mounted or fixed to a carrier structure like a PCB. For example, the lid may be glued or clamped to the pre-mold.

Figure 2A:
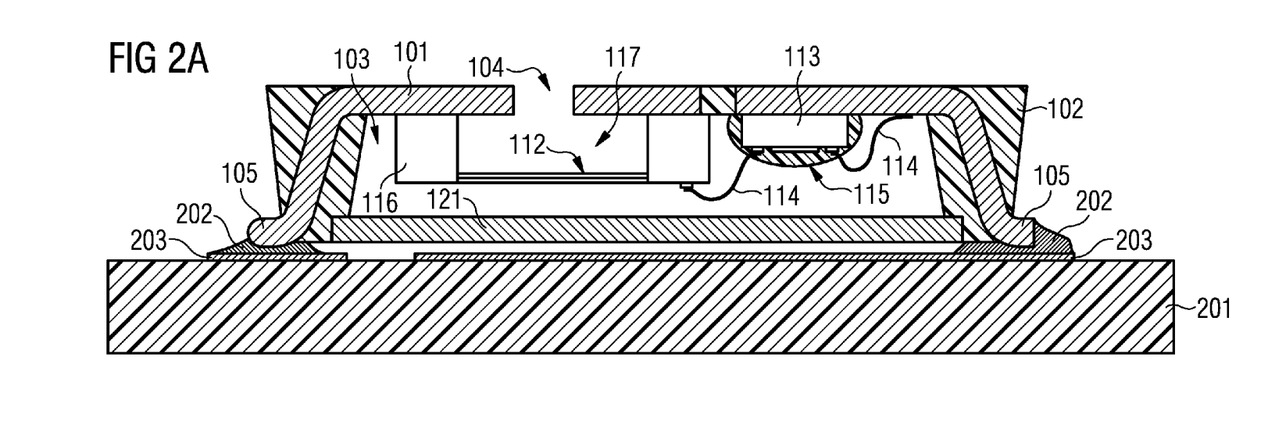
FIG. 2A schematically shows a microphone assembly according to an exemplary embodiment attached to a carrier substrate.

FIG. 2 schematically shows microphone assemblies, e.g. configured as MEMS microphone assemblies, attached to carrier structures. In particular, FIG. 2A shows the MEMS microphone assembly 122 of FIG. 1C bonded or soldered to a carrier structure 201, e.g. a PCB. To illustrate this solder material 202 is schematically shown in FIG. 2A. Additionally electrically conductive layers or structures 203 are shown in FIG. 2A as well which may serve as ground or earth for the microphone assembly and may at the same time serve as an additional shielding layer for the microphone assembly to protect the same against electromagnetic interferences.

Figure 2B:
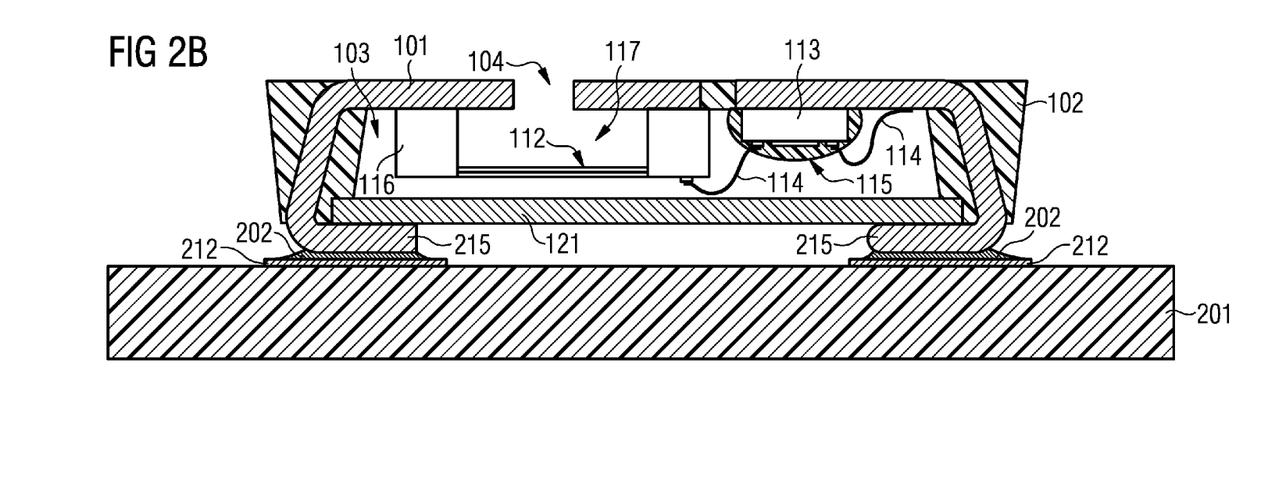
FIG. 2B schematically shows a microphone assembly according to another exemplary embodiment attached to a carrier substrate.

FIG. 2B schematically shows another microphone assembly differing from the one shown in FIG. 2A therein that projection portions 215 of the leadframe 101 are bent in another direction. In particular, the leadframe depicted FIG. 2A provides for a so called gull wing leaded package while the one depicted in FIG. 2B provides for a so called J-bend leaded package which provides a larger bonding area of the projection portions or leads of the leadframe.

Both microphone assemblies shown in FIG. 2 are so called top port versions since in both cases the port of the microphone 111 realized by the through-hole 104 is located at the top, i.e. on the main surface of the microphone assembly opposite to the side where the assembly is fixed to the carrier structure.

Figure 3:
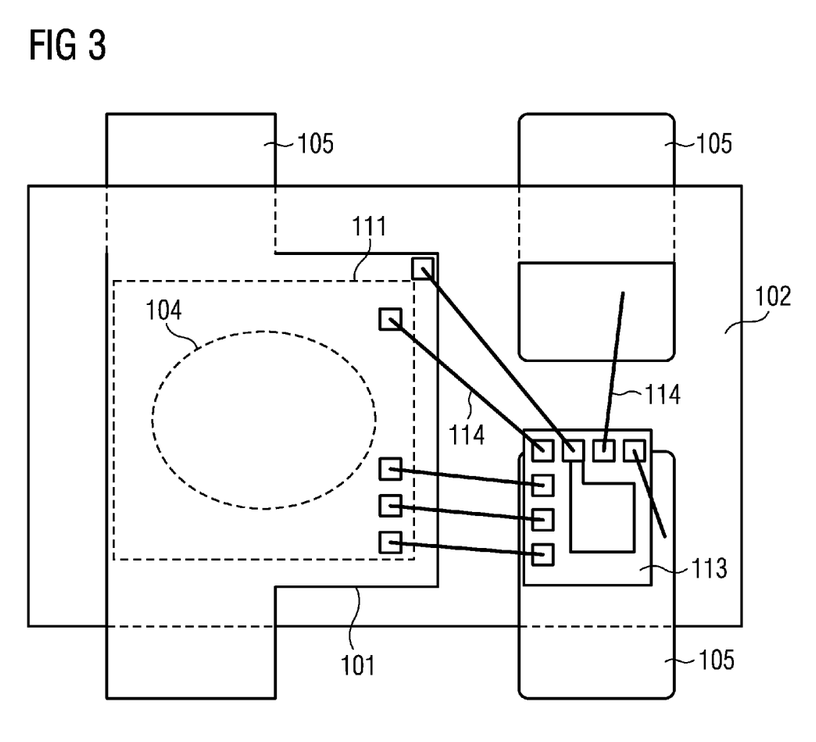
FIG. 3 schematically shows a top view of a microphone assembly.

FIG. 3 schematically shows a top view of a microphone assembly similar to the one shown in FIG. 2A. However, the leads 105 of the leadframe 101 are guided out of the mold body 102 in another direction. From FIG. 3 it can be seen that portions of the leadframe 101 are formed to provide a shielding function for the microphone 111 and the ASIC 113. That is, the leadframe 101 is primarily arranged below or above the areas of the microphone assembly where the microphone 111 and the ASIC is arranged.

FIG. 4 schematically shows a method for manufacturing a microphone assembly according to another exemplary embodiment, wherein the respective microphone assembly may be advantageously used in a bottom port version. In particular, FIG. 4A shows a pre-mold 400 comprising a bent leadframe 401 which is cast-in in a mold body 402. The mold body 402 together with the leadframe 402 forms an open cavity 403 which is connected to the outside by a through-hole 404 in a bottom portion of the pre-mold. Portions 405 of the leadframe 401 do not project out of the mold body 402 but still may be used for electric connection afterwards. For example, in case portions of the leadframe 401 are guided to the upper side of the pre-mold the lid 421 may be easily electrically connected with the leadframe, e.g. for providing ground. The main difference to the embodiment of a pre-mold shown in FIG. 1A is that the size or extension of the leadframe 401 is smaller than the one shown in FIG. 1A. This is due to the fact that the leadframe 401 may not be used as a shielding for the microphone and other semiconductor chips, like ASICs when arranged in the cavity 403.

Figure 4A:
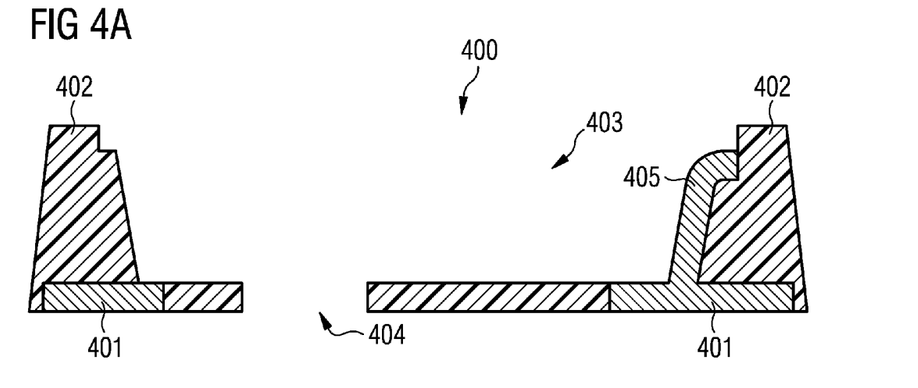
FIGS. 4A-4D show a microphone assembly in different stages of manufacture according to another exemplary embodiment.
Figure 4B:
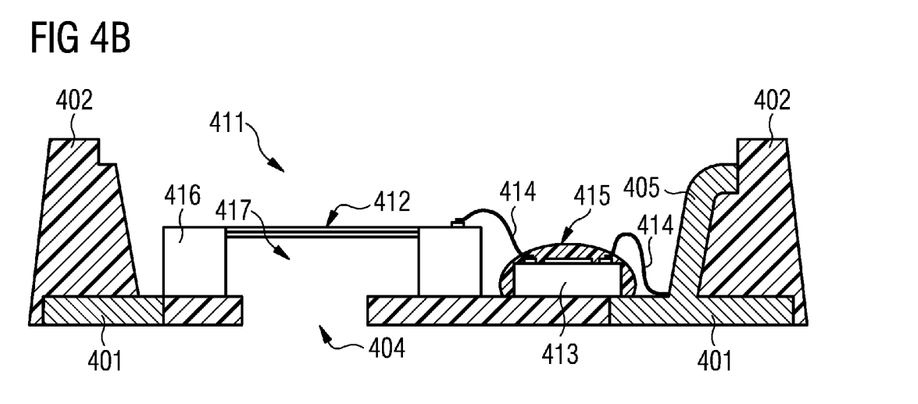

FIG. 4B shows the pre-mold of FIG. 4A after a microphone, in particular a MEMS microphone, is arranged, e.g. die-bonded or flip-chip mounted, in and attached to the cavity 403. The microphone 411 comprises a membrane element 412 and a rim portion 416 to which the membrane element is fixed. The rim portion 416 together with the membrane element forms a front volume 417 of the microphone 411. For example, the microphone may be glued, soldered, surface mounted, flip-chip mounted or die-bonded to the bottom portion of the pre-mold 400. In particular, the microphone 411 is arranged directly over the through-hole 404, so that the front volume 417 is in direct or fluid connection or in acoustic communication with the through-hole 404 and the cavity 403 forms the rear volume of the microphone 411. Additionally an ASIC 413 is arranged, e.g. die-bonded or flip-chip mounted, in the cavity as well and is connected via bond-wires 414 to the microphone 411 and to the leadframe 401 for electrically connecting the microphone 411 at itself to the leadframe 401. The ASIC is covered by a protection layer 415, which may be made of a polymeric material. The protection layer 415 may prevent corrosion of open aluminum contacts or the like of the ASIC.

Figure 4C:
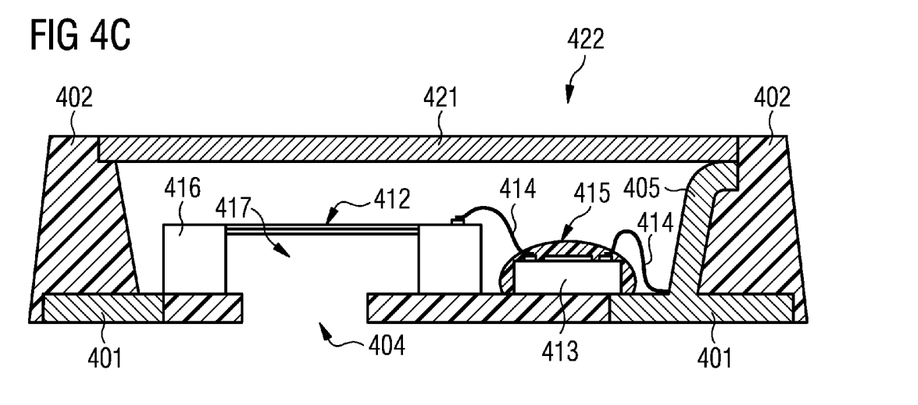

FIG. 4C shows the pre-mold of FIG. 4B further comprising a lid 421 arranged on top of the pre-mold 400 and covering or closing the cavity 403. In contrast to the lid 121 described in the context of FIG. 1A, the lid 421 comprises electric conductive material, e.g. is formed by a metal layer. For example, the lid may be glued (by electrically conductive glue) or clamped to the pre-mold. For example, the lid 421 may be produced by a punching or stamping process. Thus, the lid 421 may provide shielding functions and may be used to electrically connect portions 405 of the leadframe to external interfaces. In particular FIG. 4C depicts the main components of a microphone assembly 422 which can afterwards be die-bonded, soldered or mounted or fixed to a carrier structure like a PCB.

Figure 4D:
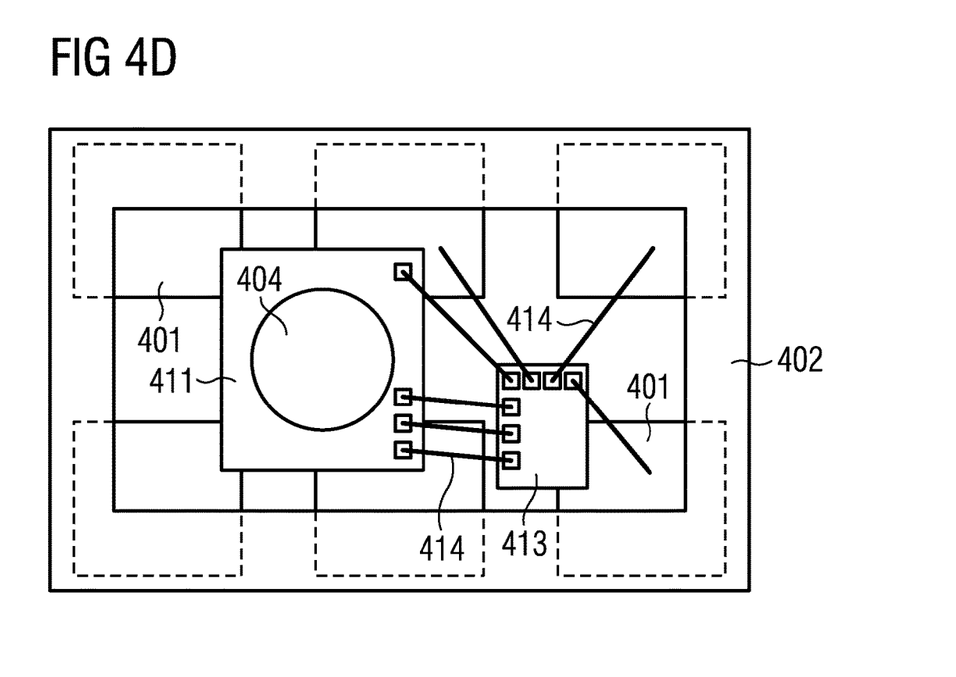

FIG. 4D schematically shows a bottom view of the microphone assembly 422 of FIG. 4B. From FIG. 4D it can be seen that the leadframe 401 is not arranged in the areas where the microphone 411 and the ASIC 413 are arranged. Thus, it cannot provide for a sufficient shielding function However, since the microphone assembly 422 of FIG. 4 is primarily intended for bottom port versions the shielding function may be taken by the lid 421. In principle, the leadframe depicted in FIG. 4 provides for a so called leadless or no-lead package.

Figure 5:
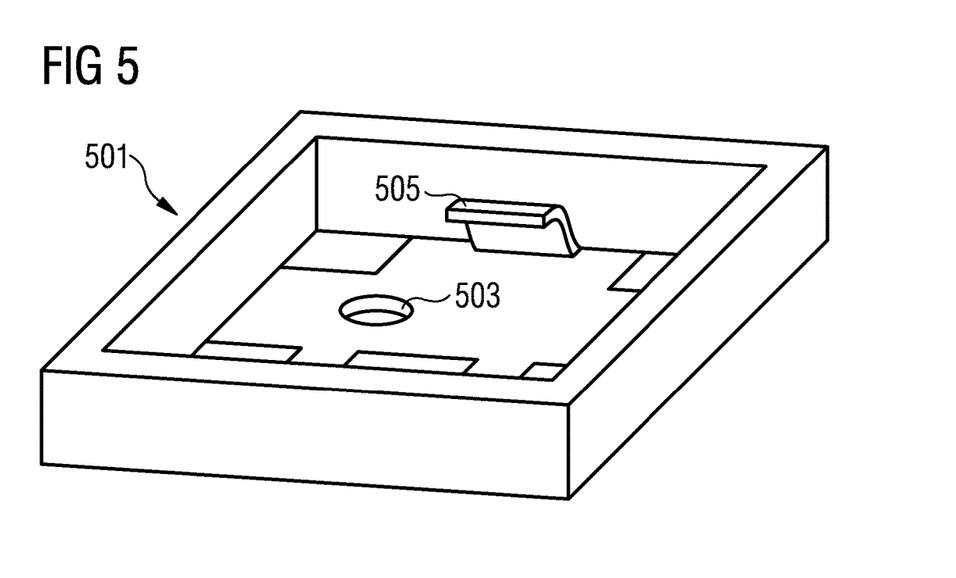
FIG. 5 schematically shows a leadframe in a perspective view.

FIG. 5 schematically shows a leadframe 501 in a perspective view which can be used as a leadframe for a pre-mold shown in FIG. 4, for example. The leadframe 501 comprises a through-hole 503 and a portion 505 which is bent so that it can provide for a contact to a lid arranged on the leadframe afterwards.

Figure 6A:
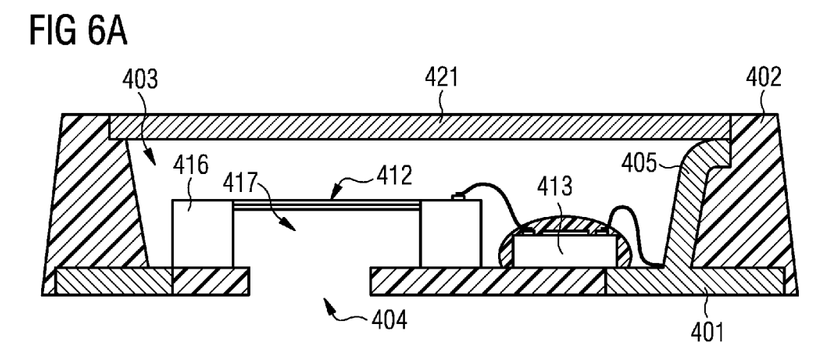
FIG. 6A schematically shows a type of package.

FIG. 6 schematically shows different types of packages similar the ones depicted in FIG. 2A and FIG. 2B for a bottom port microphone assembly as shown in FIGS. 4A to 4C. In particular, FIG. 6A shows the leadless package as depicted in FIG. 4C.

Figure 6B:
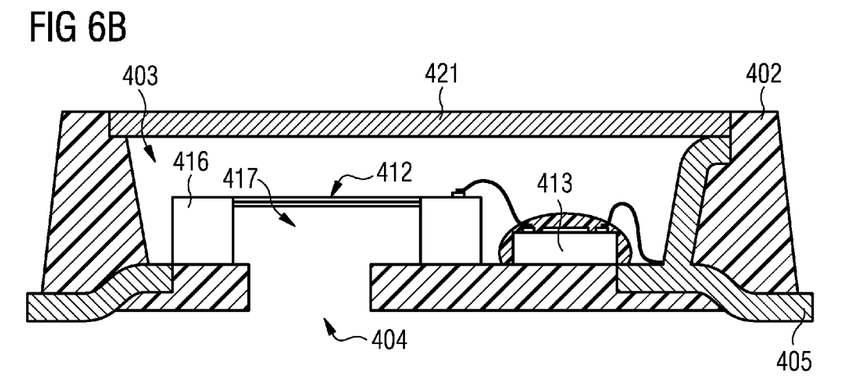
FIG. 6B schematically shows another type of package.

FIG. 6B shows the so called gull wing leaded packages similar to the one shown in FIG. 2A however for the case the microphone assembly is used for a bottom port version. Thus, the lid 421 is advantageously of electrically conductive material, e.g. metal.

Figure 6C:
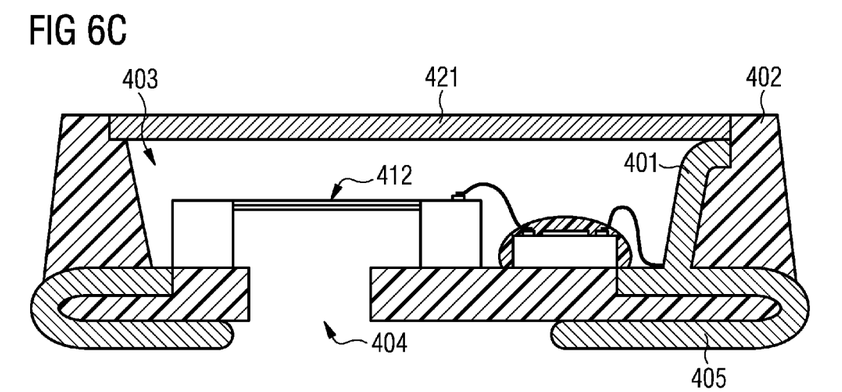
FIG. 6C schematically shows another type of package.

FIG. 6C shows the so called J-bend leaded packages similar to the one shown in FIG. 2B however for the case the microphone assembly is used for a bottom port version. Thus, the lid 421 is advantageously of electrically conductive material, e.g. metal.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A microphone assembly comprising:
   a pre-mold,
   a microphone
   a carrier structure, and
   a lid;
   wherein the pre-mold comprises:
   a bent leadframe, and
   a mold body,
   wherein the mold body is molded to at least partially encapsulate the bent leadframe to build the pre-mold comprising a cavity for accommodating a microphone,
   wherein the mold body and the leadrame form a bottom surface with lateral faces without a top surface for forming the cavity, and
   wherein the pre-mold comprises a through-hole transmissive for sound waves,
   wherein the microphone comprises a membrane element arranged in the cavity of the pre-mold and coupled to the bottom surface,
   wherein the pre-mold is attached to the carrier structure,
   wherein the membrane element of the microphone is arranged in fluid connection with the through-hole, and
   wherein the lid is arranged on the mold body and is electrically insulating,
   wherein the lid is covering the cavity at the top surface and the lid being positioned between the microphone and the carrier structure, and
   a shielding layer arranged between the lid and the carrier structure,
   wherein the shielding layer is formed on the carrier structure.

2. The microphone assembly according to claim 1, wherein the pre-mold forms a gull-wing leaded package type.

3. The microphone assembly according to claim 1, further comprising electrical contact interfaces electrically connected to the leadframe.

4. The microphone assembly according to claim 1, wherein the pre-mold comprises a base portion in which the through-hole is formed.

5. The microphone assembly according to claim 4, wherein at least one exposed portion of the lead frame is guided out of the pre-mold at one portion out of the group consisting of:
   at the bottom portion; and
   at a top portion opposite to the bottom portion.

6. The microphone assembly according to claim 1, wherein the microphone is a micro-electro-mechanical system microphone.

7. The microphone assembly according to claim 1, wherein the microphone is electrically connected with the leadframe.

8. The microphone assembly according to claim 1, further comprising an ASIC chip arranged in the pre-mold and electrically connected to the microphone.

9. The microphone assembly according to claim 8, wherein the ASIC chip is covered by a protection layer.

10. A microphone assembly configured as a microelectromechanical system, the microphone assembly comprising:
    a housing structure comprising a through-hole, a bent leadframe, and a mold body;
    a microphone configured as a microelectromechanical system comprising a membrane element and a rim portion forming a circumferential fixing of the membrane element to a bottom surface and surrounding a front volume of the microphone,
    a carrier structure,
    a lid which is arranged on the housing,
    wherein the microphone is arranged in the housing structure so that the through-hole is in fluid connection with the front volume of the microphone,
    wherein the mold body is molded to at least partially encapsulate the bent leadframe to build the pre-mold comprising a cavity for accommodating a microphone,
    wherein the mold body and the leadrame form the bottom surface with lateral faces without a top surface for forming the cavity,
    wherein the housing is attached to the carrier structure, and
    wherein the lid is arranged on the mold body positioned between the microphone and the carrier structure and is electrically insulating,
    wherein the lid is covering the cavity at the top surface, and a shielding layer arranged between the lid and the carrier structure, wherein the shielding layer is formed on the carrier structure.

* * * * *